United States Patent [19]
Bowman

[11] 3,709,695
[45] Jan. 9, 1973

[54] FABRICATION OF SEMICONDUCTOR DEVICES

[75] Inventor: Ronald R. Bowman, Phoenix, Ariz.

[73] Assignee: Motorola, Inc., Franklin Park, Ill.

[22] Filed: July 16, 1970

[21] Appl. No.: 55,579

Related U.S. Application Data

[63] Continuation of Ser. No. 528,540, Feb. 18, 1966, abandoned.

[52] U.S. Cl. ..........................96/36.2, 96/36, 29/578, 29/579, 156/17, 252/79.1, 252/79.4, 252/79.5

[51] Int. Cl. ...........G03c 5/00, H011 5/00, H011 7/00

[58] Field of Search .........96/36.2; 156/17; 252/79.4, 252/79.5, 79.1; 29/578, 579

[56] References Cited

UNITED STATES PATENTS

| | | | |
|---|---|---|---|
| 2,649,361 | 8/1953 | Springer et al. | 252/79.1 |
| 2,981,877 | 4/1961 | Noyce | 96/36.2 X |
| 3,079,254 | 2/1963 | Rowe | 96/36.2 |
| 3,116,184 | 12/1963 | Miller | 156/17 X |
| 3,423,262 | 1/1969 | Barditoh et al. | 156/17 X |
| 3,436,279 | 4/1969 | Klein | 156/17 X |

FOREIGN PATENTS OR APPLICATIONS

| | | | |
|---|---|---|---|
| 482,095 | 3/1938 | Great Britain | 252/79.1 |

OTHER PUBLICATIONS

Eastman Kodak Handbook, "Photosensitive Resists For Industry," 1962, p. 41.

*Primary Examiner*—Charles L. Bowers, Jr.
*Attorney*—Mueller, Aichele & Gillman

[57] ABSTRACT

A germanium mesa transistor is fabricated having an epitaxially grown base region and an aluminum alloy emitter in the epitaxially grown layer spaced from the collector junction, and having a gold-comprising base electrode surrounding the emitter and closely spaced therefrom. The gold contact is formed by photolithographic and selective etching techniques, followed by the formation of the aluminum emitter, which is also formed by photolithographic and selective etching techniques. A key step is the selective removal of the aluminum from the germanium wafer without disturbing the gold contact.

2 Claims, 6 Drawing Figures

INVENTOR.
Ronald R. Bowman
BY
Mueller, Aichele & Rauner
ATTY'S.

FABRICATION OF SEMICONDUCTOR DEVICES

This application is a Continuation of U.S. application Ser. No. 528,540, filed Feb. 18. 1966, now abandoned.

This invention relates to a new method of fabricating semiconductor devices, and more particularly relates to a novel method of fabricating germanium semiconductor devices and relates to a novel germanium device.

It has been customary to fabricate germanium transistors with a plurality of metal stripes across the top surface thereof. One stripe is an emitter which is alloyed into the structure, and the other stripe or stripes are base contacts. These stripes are commonly formed by the so-called "cross-evaporation" technique, involving the placement of a substrate on a heated plate and spacing a metal mask above the plate. The mask has an opening through which the emitter metal and the base contact metal are sequentially evaporated at an angle to the surface of the mask.

The cross-evaporation process, however, has a number of serious drawbacks. One is the matter of cost, since the masks are relatively expensive and the process limits lot sizes to about six or seven wafers per run. Another problem is that of resolution of the pattern since the masks are spaced from the substrate surface, and the evaporation is at an angle to the wafer surface. These problems create a practical lower limit to the cross-sectional area and spacing of the stripes. The spacing and cross-sectional area, in turn, limit the high frequency response of the resulting device.

An object of the present invention is to provide a method of fabricating a germanium semiconductor device which provides a high degree of freedom of device geometry.

Another object of the invention is to provide a method of fabricating a germanium semiconductor device which permits closer spacing between an alloyed emitter and a base contact.

An additional object of the invention is to provide a germanium semiconductor device which has a high degree of resolution of the metal portions on the surface.

A further object of the invention is to provide a germanium mesa transistor having higher frequency response and lower noise level than previously attainable.

A feature of the invention is a method of fabricating a germanium semiconductor device using a photosensitive material in which substantially all particles therein are of a size less than about one micron.

Another feature of the invention is a novel method of fabricating a semiconductor device having improved definition of metal geometry achieved through the use of the above photosensitive material in combination with an etchant for a gold-containing layer comprising an alkali metal compound and an organic acid derivative.

The invention will be illustrated by the accompanying drawing in which.

Figure 1:
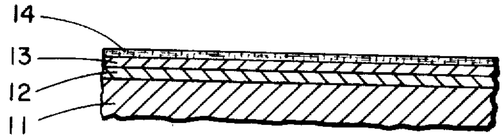
FIG. 1 is a cross-sectional view of a semiconductor structure with a gold layer thereon in the fabrication of a semiconductor device of the invention.

The present invention is embodied in a method of fabricating a semiconductor device including the steps of forming a gold-containing layer over a base region surface of a germanium crystal element, coating the gold layer with photosensitive material in which substantially all particles therein are of a size less than about 1 micron, developing a pattern in the photosensitive coating, and removing portions of the gold layer exposed through the pattern with an etchant comprising an alkali metal compound and an organic acid derivative to form a gold layer of predetermined geometry.

The invention also is embodied in a semiconductor device comprising a single crystal germanium substrate, an epitaxially grown layer on the substrate, a base region in the surface portion of the layer of different conductivity type than the remainder thereof to form a collector junction, an alloyed metal emitter in the epitaxially grown layer spaced from the collector junction, and a gold-containing layer on the surface of the epitaxially grown layer adjacent to and in close relationship with the emitter, the epitaxial material being of a predetermined horizontal size smaller than that of the substrate.

The substrate treated in accordance with the method of the present invention as pointed out above is a single crystal germanium element which preferably is a thin wafer. The wafer may be obtained from a larger crystal grown by known crystal pulling or zone melting processes. The larger crystal is sliced into wafers, and the wafers are lapped, polished and otherwise processed to make their major faces substantially parallel to each other. The cross-sectional dimension of the wafers may be of any value and the thickness of the wafers can be within a practical range, e.g., about 3 to 8 mils.

Advantageously, additional material of desired resistivity and doping is grown on the surface of the substrate by epitaxial deposition processes known in the art. In such processes, a semiconductor compound such as germanium tetrachloride in a diluted mixture with an inert carrier gas such as hydrogen is passed over the germanium substrate heated to an elevated temperature, for example, about 500° to 850°C, to form a layer of material on the surface of the substrate. In the preferred form of the invention, the entire device is formed in the epitaxially grown layer and the substrate acts only as a carrier or support for the device.

A base region is formed in the structure, preferably by diffusing an impurity material into the surface of the crystal element. If a diffusion is made into the epitaxial layer, a base region of different conductivity type from the remainder of the epitaxial material forms a collector junction with the undiffused portion of the epitaxial layer.

After the base region is formed, a thin layer of gold or a gold-containing alloy is formed over the base region surface of the crystal element. The layer may be formed by known thin film deposition methods such as vacuum evaporation, sputtering, gas plating, electroplating, electroless plating, etc. Advantageously, the thin film is formed by vacuum evaporation in which the substrate is heated in a high vacuum, and a tungsten filament is heated to vaporize a gold charge of predetermined size and form a coating on the surface of the crystal element. The gold-containing layer generally is very thin and preferably has a thickness between about 1,000 and 5,000 Angstroms and particularly between about 2,000 and 3,000 Angstroms. As mentioned above, the layer may be of elemental gold or may be a gold alloy including other elements such as silver, indium, antimony, arsenic, etc.

After the gold layer has been formed on the surface of the structure, a photosensitive material is applied over the gold. It is essential that the photosensitive material, as mentioned above, have substantially all the particles therein of a size less than about one micron. Commercially available materials have a particle size substantially larger in size, and it is necessary to eliminate the larger size particles before such materials may be employed for the purpose of the invention. Examples of preferred organic materials include materials sold by Eastman Kodak Company under the trade names, Kodak Metal Etch Resist and Kodak Thin Film Resist, and sold by Shipley Chemical Company as AZ 1350, etc. One way of removing the larger particles is to centrifuge the composition in a micro-centrifuge. The photosensitive material may be thinned with a suitable solvent such as trichloroethylene, etc., and applied to the gold layer by various known methods including spinning, spraying, roller coating, etc. The thickness of the photosensitive coating is preferably between about 0.3 and 2.5 microns, and particularly between about 0.3 and 1 micron.

A pattern having a large number of repeated representations is exposed onto the photosensitive coated surface of the crystal element or wafer causing the portion of the surface exposed to light to harden and the unexposed portion to remain in soluble condition. When the soluble portions are removed such as by washing with a solvent, e.g., methylethylketone, etc., a desired pattern of openings is formed on the surface of the gold layer.

The portions of the gold layer exposed through the pattern are then removed with an etchant which advantageously comprises an alkali metal salt and an organic acid derivative. Preferably, a combination of alkali metal salts such as cyanides and carbonates of sodium and potassium is employed. The organic acid derivative may be an acid or a salt thereof and advantageously, is an aromatic acid preferably a benzoic acid. Particular useful results are achieved when the acid is a nitrobenzoic acid, e.g., meta-nitrobenzoic acid.

The relative portions of the ingredients in the etchant may vary over a considerably range with the proportions of the alkali metal salt and the organic acid derivative being approximately the same and preferably between about 40 and 60 percent by weight of each. The salt and acid derivative advantageously are mixed with water and preferably form an aqueous solution. The use of between about 5 and 20 percent by weight of dissolved solids in the solution is particularly desirable. Preferably, the solution contains between about 1 and 5 percent by weight of an alkali metal cyanide between about 1 and 5 percent by weight of an alkali metal carbonate, between about 3 and 10 percent by weight of a nitrobenzoic acid derivative and the balance water.

While the above method may be employed to form a gold layer of predetermined geometry or configuration on the surface of a semiconductor crystal element and particularly to form a gold contact for the base region of a device, the method also may be combined with the formation of an alloyed metal emitter. Such an emitter may be formed in one of several ways. For example, a layer of metal such as aluminum or an aluminum alloy, e.g., containing antimony, arsenic, gallium, etc., may be formed over the surface of a wafer initially by well-known methods of forming metal coatings such as one of the methods suitable for forming the gold layer. After the metal layer is formed on the base region surface of the wafer, a photosensitive material is applied over the metal, the material being of the type described above, in which substantially all of the particles are of a size less than about 1 micron. A pattern having a large number of repeated representations is then exposed onto the photosensitive coating and the pattern developed to expose portions of the metal layer. The thickness of the metal layer is advantageously between about 1,500 and 10,000 Angstroms and preferably between about 2,000 and 3,500 Angstroms. The exposed metal is then etched through the pattern to remove the metal exposed and form a pattern of desired predetermined geometry. The etchant employed may be the same one employed for the gold above, that is, including an alkali metal compound and an organic acid derivative. The remaining metal is alloyed into the base region by heating the structure to a temperature above about 423°C and preferably between about 440°C and 460°C to form an alloyed emitter.

The resulting structure including the emitter, base and collector regions is processed according to the previously described method of forming a gold base contact.

Alternatively, the emitter metal may be formed after the formation of the gold base contact. The method is similar to that described above for the formation of the metal emitter except that the etchant employed to remove the unwanted metal must not deleteriously affect the gold layer which previously has been formed on the structure. In either case, the method described above provides a simple and convenient means for achieving a wide variety of base contact and emitter patterns of very small size and in close proximity to one another. The small size and close proximity provide a substantial increase in the operating frequency of the device while at the same time providing lower noise levels.

Figure 2:
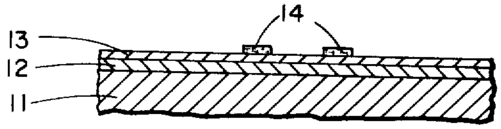
FIG. 2 is a cross-sectional view of the semiconductor structure of FIG. 1 with the gold layer in the desired geometry.
Figure 3:
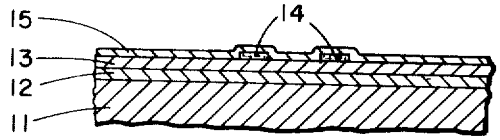
FIG. 3 is a cross-sectional view of the semiconductor structure of FIG. 2 with another metal layer over the top surface thereof.
Figure 4:
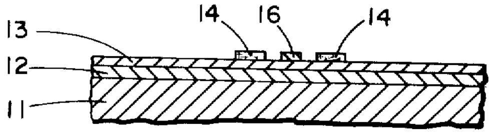
FIG. 4 is a cross-sectional view of the semiconductor structure of FIG. 3 with the metal layer in the desired geometry.
Figure 5:
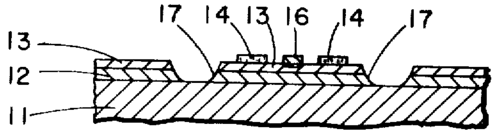
FIG. 5 is a cross-sectional view of a semiconductor device of the invention.
Figure 6:
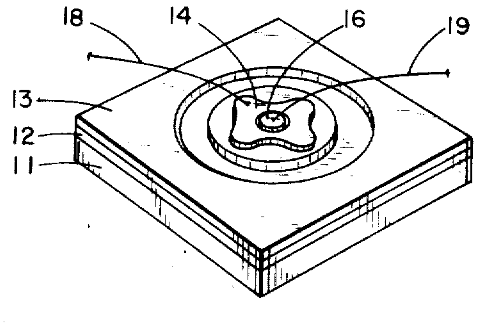
FIG. 6 is a perspective view of the device shown in FIG. 5 with leads attached.

One embodiment of the invention is shown in the drawing. In FIG. 1, a substrate 11 has an epitaxial layer grown thereon including a lower portion 12 and an upper portion 13. The substrate 11 serves as a carrier while the lower portion 12 is a collector region and the upper portion 13 is a base region. Portion 13 advantageously is formed by diffusing an impurity into the epitaxial layer. A thin gold layer 14 is formed over the surface of the structure. The gold 14 is etched away (FIG. 2) to form a predetermined geometry which is the contact to the base region 13. A metal layer, preferably aluminum 15, is then formed over the structure including the gold contact 14 in FIG. 3. FIG. 4 shows the structure after the aluminum 15 has been etched away to provide an aluminum emitter 16. In FIG. 5 is shown an etched moat 17 which surrounds the device and separates it into a discrete device on the carrier substrate 11. Also, as shown in FIG. 5 the emitter 16 has been alloyed into the base region 13. FIG. 6 shows a lead 18 attached to the gold base contact 14 and a second lead 19 attached to the emitter 16.

The method of the present invention provides a simple and convenient means for achieving closely spaced base region contact and alloyed emitter of predetermined size and relationship to one another. While the drawing illustrates an emitter completely surrounded by the base contact, other geometries may be produced depending upon the device characteristics desired.

The method of the present invention provides an important improvement in germanium devices. While germanium has potentially a faster mobility and lower noise characteristics than silicon, the difficulties in forming emitters and base contacts of proper size and geometry in the past have limited the performance of germanium devices. This limitation is no longer a factor in the method and device of the invention.

The following examples illustrate specific embodiments of the invention, although it is not intended that the examples in any way restrict the scope of the invention.

EXAMPLE I

P type conductivity germanium wafers of a size about 1 inch in diameter and 0.004 inch thick and having a resistivity of about 0.003 ohm-centimeter were placed in an epitaxial reactor through which a gas mixture containing about 3 percent by volume of germanium tetrachloride and the balance hydrogen was passed at a rate of about 2 liters per minute. After about 75 minutes, an epitaxial layer about 15 microns thick was grown over the surface of the wafers. The epitaxial layer had a resistivity of about 5 ohm-centimeters and was of a P type conductivity.

Thereafter, the wafer was placed in a diffusion furnace heated to a temperature of about 650°C in an atmosphere containing antimony vapors in a stream of hydrogen flowing through the furnace at a rate of about 2 liters per minute. After 25 minutes the wafers were removed from the furnace and examined. The diffused region on the surface of the epitaxial layer was about 0.5 micron in thickness and had a resistivity of about 0.02 ohm-centimeter and N type conductivity.

The resulting wafers were then plated with a thin gold layer about 3,000 Angstroms in thickness by a conventional vapor deposition process. After the gold layer had been formed on the surface, a coating of photosensitive material was applied to the gold surface, using a photoresist composition sold under the name Kodak Metal Etch Resist by Eastman Kodak Company. Before use, the material first was centrifuged in a micro-centrifuge at about 10,000 revolutions per minute and the heaviest portion thereof comprising about 15 percent of the sample was discarded. The remaining portion of the composition was tested by selective filtration procedures and found to have a particle size less than about 1 micron. The composition was mixed with trichloroethylene and applied to the wafers as each was held on a vacuum chuck rotating at about 8,000 rpm for 10 seconds to produce a thin photosensitive coating approximately 1 micron in thickness.

The wafers were then aligned with a photomask and exposed to intense ultraviolet light. The exposed wafers were washed with methylethylketone to remove the unexposed portions of the coating and reveal parts of the gold layer. The masked surface of the wafers was etched with an etchant comprising by weight about 3 percent sodium carbonate, about 2 percent potassium cyanide, about 5 percent m-nitrobenzoate and the remainder water. After about 3 minutes, the wafers were removed and washed with deionized water. Thereafter, the remaining portions of the photoresist coating were removed by treating the wafers with J-100 solvent sold by Aluminum Litho Corporation. The resulting wafers were examined under a high power microscope, and it was found that the gold contact on the surface of the wafers had smooth edges with sharp delineation of the four-pointed star pattern. The surface of the gold showed no evidence of attack by the etchant and was bright and clean in appearance.

Next, a layer of aluminum was formed over the surface of the wafers using conventionally employed vapor evaporation methods. A second photoresist coating was applied over the surface of the aluminum using the same technique as above and the resist exposed to ultraviolet light through a pattern. The unexposed portions were removed by treating the wafers with methylethylketone. The removal of the unexposed portions revealed part of the aluminum surface.

The wafers were then etched with a phosphoric acid solution maintained at a temperature of about 45°C. After about 5 minutes, the wafers were removed from the etchant and washed with deionized water. The remainder of the photoresist was removed with J-100. The wafers were washed again, dried and examined under a microscope. The circular portion was about one mil in diameter and about 2,500 Angstroms thick. The wafers were heated in a furnace for about three minutes at 450°C to alloy the metal into the diffused region and form an emitter of P type conductivity.

The wafers again were coated with a photoresist and a pattern developed to provide a circular opening. The wafers were etched using a CP-4 acid etching solution for about one-half minute. The epitaxial layer was etched through to the substrate separating the layer into discrete circular devices about 0.006 inch in diameter.

The wafers were then scribed and broken into dice. Each die was mounted on a header using solder, and gold wire leads were connected to the gold base contact area and the aluminum emitter. The resulting devices were tested for electrical characteristics and found to have a frequency response more than 50 percent greater than commercially available germanium mesa transistors. Also, the noise level was more than 25 percent below the level of commercial devices.

EXAMPLE II

The procedure of this example was the same as that of Example I except that the photosensitive material was Kodak Thin Film Resist, sold by Eastman Kodak Company. The material was treated in a micro-centrifuge prior to use and the material used had a particle size less than about 1 micron. The gold base contact and the aluminum emitter exhibited the same sharp patterns and delineation of the metal geometries of the devices made in Example I. Also, the electrical characteristics showed the same superiority.

EXAMPLE III

The procedure of this example was the same as that of Example I except that the etchant employed to etch the gold contained by weight about 2 percent potassium cyanide, 2 percent potassium carbonate, 6 percent potassium m-nitrobenzoate and the remainder water. Devices made according to the procedure of this example showed the same superiorities as the devices fabricated in Examples I and II.

EXAMPLE IV

The procedure of this example was the same as that of Example I except that the aluminum emitter was formed prior to the formation of the gold base contact. The etchant employed to etch the aluminum layer was the same etchant as employed to etch the gold layer. Devices prepared according to this example showed the same superior characteristics as the devices of the previous examples.

It is clear from the above description, examples and drawing that the present invention provides a novel method which permits the fabrication of devices having characteristics heretofore unattainable. For example, the devices are capable of operation at higher frequencies and with a lower noise level. This is due to the freedom of geometry of the emitter and base contact areas achievable with the method of the invention permitting substantial reductions in the size and spacial relation of the emitter and the base contact.

I claim

1. A method for the fabrication of a germanium mesa transistor comprising the steps of:

a. providing a monocrystalline germanium body having a collector region of P-type conductivity covered by a base region of N-type conductivity, b. depositing a thin gold-comprising layer on said base region;

c. applying a layer of photosensitive material in which substantially all particles therein are of a size less than 1 micron on the said gold-comprising layer, d. exposing the layer of photosensitive material to light in a pattern in order to insolubilize the exposed areas of the said layer, e. washing the photosensitive layer with a solvent for the said photosensitive material to form a photoresist image by removing the unexposed areas of said layer, f. selectively etching with an etchant containing an alkali metal cyanide salt and m-nitrobenzoic acid said gold-comprising layer in the areas not covered by the photoresist image to form a base contact of predetermined geometry, g. depositing an aluminum-comprising layer over the composite structure, including the germanium body and patterned base contact, h. applying a second layer of photosensitive material in which substantially all particles therein are of a size less than 1 micron on the said aluminum-comprising layer, i. exposing the second layer of photosensitive material to light in a pattern in order to insolubilize the exposed areas of the said layer, j. washing the photosensitive layer with a solvent for the said photosensitive material to form a photoresist image by removing the unexposed areas of said layer, k. selectively etching said aluminum comprising layer in the areas not covered by the photoresist image to form a pattern of predetermined geometry as suitable for subsequent alloying into the base region of said germanium body, l. selectively etching the resulting structure to remove a portion of the germanium body surrounding the contacts, thereby forming a mesa structure, and m. heating the composite structure to a temperature above 423°C for a time sufficient to form an alloyed emitter region within said base region, thereby completing a PNP device.

2. A method for the fabrication of a germanium mesa transistor comprising the steps of:

a. providing a monocrystalline germanium body having a collector region of P-type conductivity covered by a base region of N-type conductivity;

b. depositing an aluminum-comprising layer on said base region;

c. applying a layer of photosensitive material in which substantially all particles therein are of a size less than 1 micron on the said aluminum-comprising layer;

d. exposing the layer of photosensitive material to light in a pattern in order to insolubilize the exposed areas of said layer.

e. washing the photosensitive layer with a solvent for the said photosensitive material to form a photoresist image by removing the unexposed areas of said layer;

f. selectively etching said aluminum-comprising layer in the areas not covered by the photoresist image to form a pattern of predetermined geometry as suitable for an emitter contact for subsequent alloying into the base region of said germanium body;

g. depositing an gold-comprising layer over the composite structure, including the germanium body and patterned emitter contact;

h. applying a second layer of photosensitive material in which substantially all particles therein are of a size less than 1 micron on the said gold-comprising layer;

i. exposing the second layer of photosensitive material to light in a pattern in order to insolubilize the exposed areas of said layer;

j. washing the photosensitive layer with a solvent for the said photosensitive material to form a photoresist image by removing the unexposed areas of said layer;

k. selectively etching, with an etchant containing an alkali metal cyanide salt and M-nitrobenzoic acid said gold-comprising layer in the areas not covered by the photoresist image to form a base contact partially encircling said emitter contact;

l. selectively etching the resulting structure to remove a portion of the germanium body surrounding the contacts, thereby forming a mesa structure; and m. heating the composite structure to a temperature above 423°C for a time sufficient to form an alloyed emitter region within said base region, thereby completing a PNP device.

* * * * *